United States Patent
Yamashita

(10) Patent No.: US 8,654,170 B2
(45) Date of Patent: Feb. 18, 2014

(54) OPTICAL DEVICE, IMAGE FORMING APPARATUS, AND METHOD FOR CONTROLLING OPTICAL DEVICE

(75) Inventor: Hidetoshi Yamashita, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 116 days.

(21) Appl. No.: 13/448,592

(22) Filed: Apr. 17, 2012

(65) Prior Publication Data

US 2012/0275476 A1 Nov. 1, 2012

(30) Foreign Application Priority Data

Apr. 27, 2011 (JP) .................................. 2011-099931

(51) Int. Cl.
*B41J 2/435* (2006.01)
*B41J 2/385* (2006.01)

(52) U.S. Cl.
USPC ............................ 347/246; 347/236; 347/131

(58) Field of Classification Search
USPC ........ 347/131, 236, 246; 372/29.014–29.015, 372/38.02, 38.07
See application file for complete search history.

(56) References Cited

U.S. PATENT DOCUMENTS

| | | | | |
|---|---|---|---|---|
| 4,390,265 A | * | 6/1983 | Suzuki et al. | 399/55 |
| 4,890,288 A | * | 12/1989 | Inuyama et al. | 372/31 |
| 8,130,251 B2 | | 3/2012 | Yamashita | |
| 2010/0066799 A1 | | 3/2010 | Yamashita | |
| 2010/0150591 A1 | | 6/2010 | Yamashita | |
| 2012/0007933 A1 | | 1/2012 | Yamashita | |
| 2012/0069128 A1 | | 3/2012 | Yamashita et al. | |

FOREIGN PATENT DOCUMENTS

| | | | |
|---|---|---|---|
| JP | 2003060289 A | * | 2/2003 |
| JP | 2008-62444 | | 3/2008 |
| JP | 2009-15895 | | 1/2009 |
| JP | 2009015895 A | * | 1/2009 |
| JP | 4698086 | | 3/2011 |

OTHER PUBLICATIONS

U.S. Appl. No. 13/444,309, filed Apr. 11, 2012, Yamashita.

* cited by examiner

*Primary Examiner* — Sarah Al Hashimi
(74) *Attorney, Agent, or Firm* — Oblon, Spivak, McClelland, Maier & Neustadt, L.L.P.

(57) ABSTRACT

An optical device includes a drive unit configured to drive a light source that outputs a laser beam; a detecting unit configured to detect the laser beam output from the light source; a converting unit configured to convert an output of the detecting unit into a value within a predetermined range; and a control unit configured to control the drive unit to switch a light quantity of the laser beam output from the light source from a first light quantity within an imaging light quantity range for forming an image to a second light quantity outside the imaging light quantity range, or vice versa. The converting unit converts an upper limit light quantity in the imaging light quantity range into a maximum value in the predetermined range, and converts a lower limit light quantity in the imaging light quantity range into a minimum value in the predetermined range.

6 Claims, 6 Drawing Sheets

OPTICAL DEVICE, IMAGE FORMING APPARATUS, AND METHOD FOR CONTROLLING OPTICAL DEVICE

CROSS-REFERENCE TO RELATED APPLICATIONS

The present application claims priority to and incorporates by reference the entire contents of Japanese Patent Application No. 2011-099931 filed in Japan on Apr. 27, 2011.

BACKGROUND OF THE INVENTION

1. Field of the Invention

The present invention relates to an optical device, and an image forming apparatus, a method for controlling of the optical device.

2. Description of the Related Art

When a charged photosensitive element is exposed to a laser beam in the dark, an electrostatic latent image formed by elimination of the exposed portion is formed on the photosensitive element. Image formation is performed by developing the electrostatic latent image and transferring and fixing the developed image on a printing medium, such as a sheet of paper. After the image formation, static electricity is eliminated from the surface of the photosensitive element. At this time, a slight electrical potential remains on the surface of the photosensitive element as a residual potential. By repeating the charging, exposure, and static elimination with respect to the photosensitive element, the residual potential is gradually increased, and the results in degradation of the quality of an image formed. Therefore, in an image forming apparatus that performs image formation by scanning a photosensitive element with a laser beam, it is necessary to measure a residual potential of the photosensitive element, and when the measured residual potential exceeds a predetermined value, a user has to take action, such as replacement of the photosensitive element.

To measure a residual potential of a photosensitive element, a light quantity of a laser beam to be emitted to the photosensitive element needs to be set to be higher than that is in image formation. Therefore, there is already known a technology to allow for not only a light quantity range in image formation (hereinafter, "imaging light quantity range") but also up to a light quantity for measurement of the residual potential as the quantity of the laser beam and output a laser beam of the light quantity for measurement of the residual potential.

Japanese Patent Application Laid-open No. 2003-060289 discloses a configuration in which an electric current or voltage for determining the full scale of laser diode emission current in D/A conversion is input from an external terminal, and a quantity of light emitted from the laser diode is changed by changing the full scale. According to the Japanese Patent Application Laid-open No. 2003-060289, it is possible to perform correction (shading correction) for an increase in quantity of light to be delivered to the central portion of a photosensitive element, which occurs in a laser diode writing system that performs raster scanning.

Japanese Patent Application Laid-open No. 2009-015895 discloses a configuration in which the intensity of a light, which has been branched from a light directed toward a recording medium by a branch mirror and entering a photodetector for automatic power control (APC) that detects the intensity of a light output from a light source, is continuously or gradually changed by a light-quantity adjusting element (an ND filter, a polarization element, a liquid crystal element, or the like), thereby keeping a light for recording/reproduction within a dynamic range of the single photodetector for APC. According to Japanese Patent Application Laid-open No. 2009-015895, when a light for recording/reproduction is detected by the single photodetector for APC, the light for recording/reproduction can be kept within the dynamic range of the photodetector for APC.

However, in such a conventional configuration to output a laser beam for residual potential measurement, the light quantity is controlled just by simply extending a light quantity range of light used in image formation. Here this conventional configuration is specifically explained with reference to FIG. 10.

In general, a laser beam used in measurement of a residual potential of a photosensitive element is not required to have such a precise light quantity as a laser beam in formation of an image, so there is a tendency that it is only necessary to output a laser beam of roughly a target light quantity in the measurement of the residual potential. However, conventionally, the light quantity control is uniformly performed on even a light quantity of a laser beam for measurement of a residual potential, which is a higher light quantity than a range of the quantity of light used in image formation.

Specifically, when a laser beam for detection of a residual potential is output, as illustrated in FIG. 10, there is a light quantity range B from an upper limit of a light quantity range A of a laser beam used in image formation and a light quantity C for detection of a residual potential although a laser beam of a light quantity in the light quantity range B is not supposed to be emitted. The whole light quantity range including the light quantity range A and the light quantity range B is a range of the light quantity control. Therefore, a dynamic range of the light quantity control is greater than the light quantity range A, and the resolution of detection of a light quantity in the light quantity range A used in image formation becomes lower.

Furthermore, in Japanese Patent Application Laid-open No. 2003-060289 described above, the quantity of light emitted from the laser diode is changed by changing the full scale of laser diode emission current. However, the change in the light quantity from within the range of the light quantity used in image formation to the light quantity for residual potential detection is a great change from the shading-correction light quantity described above. Therefore, a dynamic range of the electric current or voltage input from the external terminal extends, and the problem of deterioration of the light quantity control accuracy with respect to the imaging light quantity range is not resolved.

Moreover, in Japanese Patent Application Laid-open No. 2009-015895 described above, a dynamic range of the light quantity is narrowed down by means of the light-quantity adjusting element, so it is possible to suppress the deterioration of the light quantity control accuracy with respect to the imaging light quantity range. However, a laser diode used in on an image forming apparatus, such as a copier, is generally integrated with a photodiode that monitors the light quantity; in this case, it is not possible to include such a light-quantity adjusting element as used in Japanese Patent Application Laid-open No. 2009-015895. Therefore, it is difficult to apply the method in Japanese Patent Application Laid-open No. 2009-015895 to a copier or the like, and the problem of the deterioration of the light quantity control accuracy still remains.

Therefore, there is a need for an optical device capable of improving the accuracy of the imaging light quantity control in a configuration to detect a residual potential of a photosensitive element.

SUMMARY OF THE INVENTION

It is an object of the present invention to at least partially solve the problems in the conventional technology.

According to an embodiment, there is provided an optical device that includes a drive unit configured to drive a light source that outputs a laser beam; a detecting unit configured to detect the laser beam output from the light source; a converting unit configured to convert an output of the detecting unit into a value within a predetermined range; and a control unit configured to control the drive unit to switch a light quantity of the laser beam output from the light source from a first light quantity within an imaging light quantity range for forming an image to a second light quantity outside the imaging light quantity range, or vice versa. When the control unit has switched the light quantity of the laser beam to the first light quantity, the converting unit converts an upper limit light quantity in the imaging light quantity range which is an output of the detecting unit into a maximum value in the predetermined range, and converts a lower limit light quantity in the imaging light quantity range which is an output of the detecting unit into a minimum value in the predetermined range.

According to another embodiment, there is provided an image forming apparatus that includes the optical device according to the above embodiment; and an image forming unit configured to perform image formation by scanning a photosensitive element with the laser beam.

According to still another embodiment, there is provided a method for controlling an optical device that includes driving a light source that outputs a laser beam by a drive unit; detecting the laser beam output from the light source by a detecting unit; converting output at the detecting into a value within a predetermined range by a converting unit; and controlling the drive unit to switch a light quantity of the laser beam output from the light source from a first light quantity within an imaging light quantity range for forming an image to a second light quantity outside the imaging light quantity range, or vice versa. The converting includes converting an upper limit light quantity in the imaging light quantity range which is an output of the detecting unit into a maximum value in the predetermined range and converting a lower limit light quantity in the imaging light quantity range which is an output of the detecting unit into a minimum value in the predetermined range when the light quantity of the laser beam has been switched to the first light quantity at the controlling.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
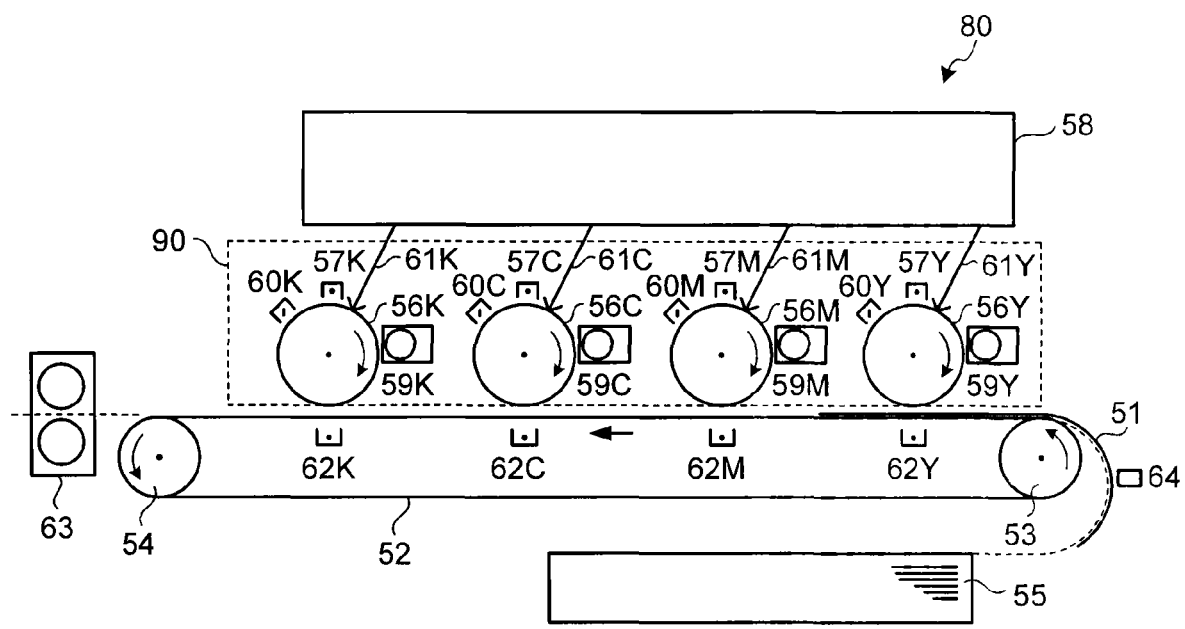
FIG. 1 is a schematic diagram schematically showing a configuration example of an image forming apparatus to which an optical device according to an embodiment of the present invention can be applied.

Exemplary embodiments of an optical device according to the present invention are explained in detail below with reference to accompanying drawings. FIG. 1 schematically shows a configuration example of an image forming apparatus 80 to which the optical device according to the embodiments of the present invention can be applied. This image forming apparatus 80 is a tandem-type color image forming apparatus capable of forming a color image using yellow (Y), magenta (M), cyan (C), and black (K) toners.

In the image forming apparatus 80, an image forming unit 90 that forms Y, M, C, and K-color images is placed along a conveying belt 52 that conveys transfer paper 51. The conveying belt 52 is supported by conveying rollers 53 and 54; one of the conveying rollers is a drive roller that is driven to rotate, and the other is a driven roller that rotates in accordance with the rotation of the drive roller. The conveying belt 52 is driven to rotate in a direction of arrow shown in FIG. 1 in accordance with the rotation of the conveying rollers 53 and 54.

Below the conveying belt 52, a paper cassette 55 that contains therein sheets of the transfer paper 51 is placed. At the time of image formation, the top sheet of the transfer paper 51 contained in the paper cassette 55 is fed to the conveying belt 52 at the timing determined by a registration sensor 64 so as to be in synchronization with the operation of an optical unit that performs optical writing of an image, and electrostatically attracted onto the conveying belt 52 by electrostatic attraction.

The attracted transfer paper 51 is conveyed to a first image forming unit for forming a Y-color image, and a Y-color image is formed on the transfer paper 51 in the first image forming unit. The first image forming unit includes a photosensitive drum 56Y, and a charger 57Y, an exposure unit 58, a developing unit 59Y, and a photosensitive drum cleaner 60Y, which are arranged around the photosensitive drum 56Y, as components. After the surface of the photosensitive drum 56Y is uniformly charged by the charger 57Y, the photosensitive drum 56Y is exposed to a laser beam 61Y corresponding to the Y-color image by the exposure unit 58, and an electrostatic latent image is formed on the photosensitive drum 56Y.

The electrostatic latent image is formed by main and sub-scanning optical beam writing; optical beam writing of a two-dimensional image on the photosensitive drum surface is performed with beam scanning from the exposure unit 58 as main scanning and the rotation of the photosensitive drum as sub-scanning perpendicular to the main scanning.

The electrostatic latent image formed on the surface of the photosensitive drum 56Y is developed into a toner image by the developing unit 59Y. The toner image formed on the photosensitive drum 56Y is transferred onto the transfer paper 51 at a contact position between the photosensitive drum 56Y and the transfer paper 51 on the conveying belt 52 (a transfer position) by a transfer unit 62Y, and a single Y-toner image is formed on the transfer paper 51. After the transfer of the Y-toner image, unwanted toner remaining on the surface of the photosensitive drum 56Y is removed by the photosensitive drum cleaner 60Y to prepare for the next image formation.

The transfer paper 51 onto which the single Y-toner image has been transferred in the first image forming unit in this way is conveyed to a second image forming unit for forming an M-color image in accordance with the rotation of the conveying belt 52. Also in the second image forming unit, in the same manner as in the first image forming unit, an M-toner image is formed on a photosensitive drum 56M, and transferred onto the transfer paper 51 so as to be superimposed on the already-formed Y-toner image. After that, the transfer paper 51 is further conveyed to a third image forming unit for forming a C-color image and then conveyed to a fourth image forming unit for forming a K-color image, and C and K toner images formed as in the above-described Y and M toner images are sequentially transferred onto the transfer paper 51 so as to be superimposed on the already-formed toner images. Upon completion of the transfer of the YMCK toner images, a color image is formed on the transfer paper 51.

The transfer paper 51 on which the color image has been formed through the fourth image forming unit is separated from the conveying belt 52, and conveyed to a fixing unit 63. After the color image is fixed on the transfer paper 51 by the fixing unit 63, the transfer paper 51 is discharged to the outside of the image forming apparatus 80.

Figure 2:
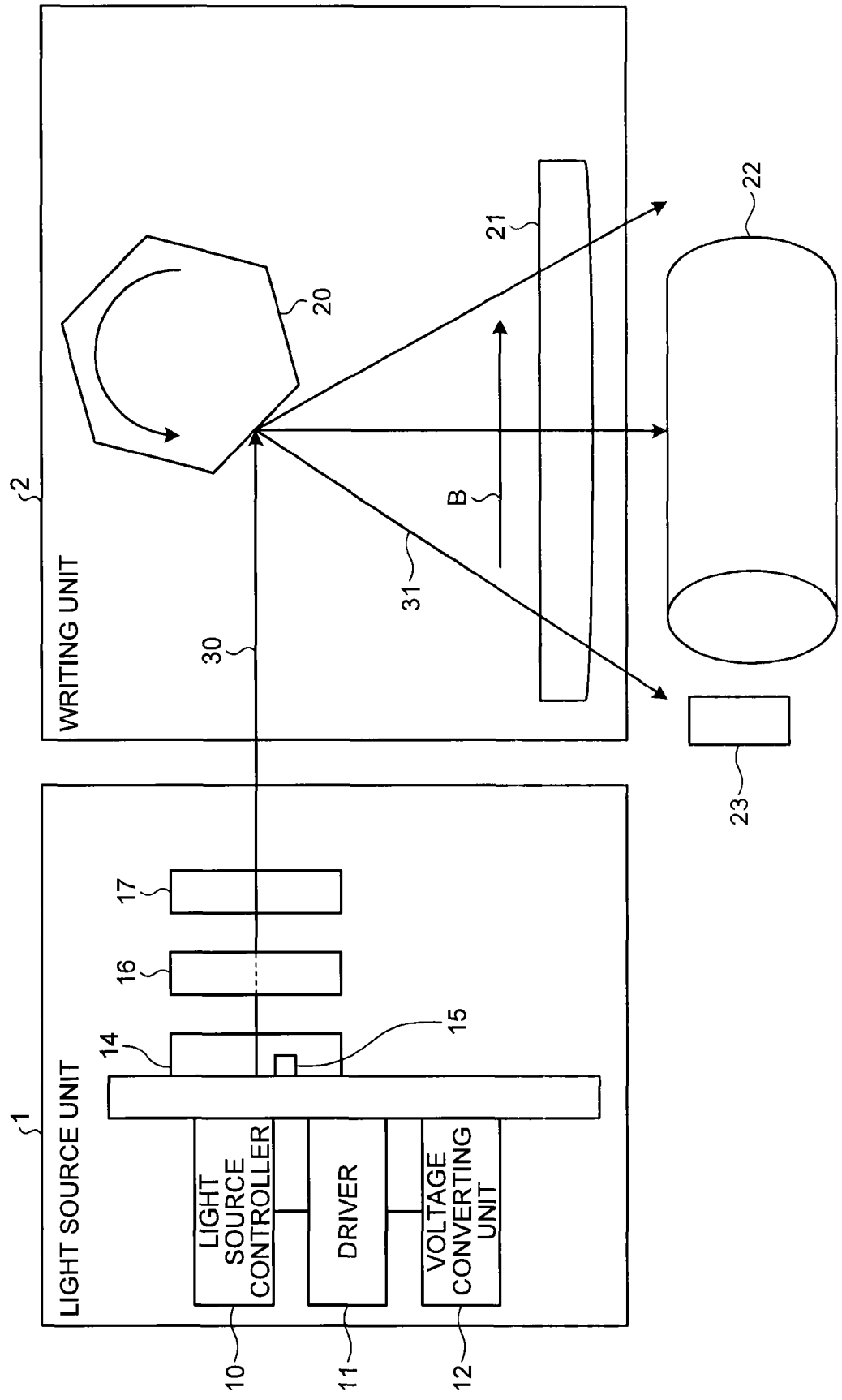
FIG. 2 is a schematic diagram schematically showing a configuration example of an optical device applicable to the embodiment of the present invention.

FIG. 2 schematically shows a configuration example of an optical device applicable to the present embodiment; the optical device is included in the exposure unit 58 of the image forming apparatus 80 illustrated in FIG. 1. The optical device includes a light source unit 1 and a writing unit 2. The light source unit 1 includes a light source section and a light receiving section; the light source section emits a laser beam 30, and the light receiving section receives the laser beam 30 emitted from the light source section to measure a light quantity of the laser beam 30. The writing unit 2 includes an optical system for bringing the laser beam 30 emitted from the light source section onto a photosensitive drum 22.

In the optical device, the light source section includes a laser beam light source 14, a light source controller 10, a driver 11, and a voltage converting unit 12. The laser beam light source 14 emits the laser beam 30. The light source controller 10 is involved in drive control of the laser beam light source 14. The light source controller 10 is composed of, for example, an application specific integrated circuit (ASIC).

The laser beam light source 14 is composed of, for example, a laser diode, and outputs the laser beam 30 of a light quantity depending on a drive current supplied from the driver 11. The number of laser beams output from the laser beam light source 14 is not limited to one; the laser beam light source 14 can be configured to simultaneously output a plurality of laser beams. As a light-emitting device capable of simultaneously outputting a plurality of laser beams, for example, a laser diode array composed of an array of a plurality of laser diodes or a vertical cavity surface emitting laser (VCSEL) can be used.

The optical system includes a coupling optical element 16, an aperture 17, a polygon mirror 20, and an fθ lens 21. The laser beam 30 emitted from the laser beam light source 14 is formed into a parallel light by the coupling optical element 16, and then shaped by the aperture 17, and after that, the laser beam 30 is delivered to the polygon mirror 20, which rotates at a predetermined speed, and is deflected by the polygon mirror 20, thereby becoming a scanning beam 31. The scanning beam 31 passes through the fθ lens 21, and hits the photosensitive drum 22. The photosensitive drum 22 is scanned with the scanning beam 31 in a main scanning direction (a direction of an arrow B shown in FIG. 2) in accordance with the rotation of the polygon mirror 20.

A synchronization detecting unit 23 is placed at the scanning start position of the photosensitive drum 22. The synchronization detecting unit 23 includes, for example, a photodiode as a light receiving element, and converts the incident laser beam 30 (the scanning beam 31) into an electric current and outputs the electric current. This output of the synchronization detecting unit 23 is used as a synchronization signal for the timing of various controls relating to the scanning with the scanning beam 31.

Furthermore, a light receiving element 15 for monitoring the light quantity of the laser beam 30 output from the laser beam light source 14 is placed in the laser beam light source 14 of the light source unit 1. The light receiving element 15 is composed of, for example, a photodiode, and converts an incident laser beam into a current signal depending on the light quantity and outputs the current signal. The light receiving element 15 is placed so that a back beam of the laser diode can be delivered to the light receiving element 15. The placement of the light receiving element 15 is not limited to this; alternatively, a half mirror or an aperture mirror can be placed on an optical path of the laser beam 30 emitted from the laser beam light source 14, and the light receiving element 15 can be placed so that the laser beam 30 reflected from the half mirror or aperture mirror can be delivered to the light receiving element 15.

The current output from the light receiving element 15 is converted into a voltage by a resistance element or the like in the voltage converting unit 12, and the voltage converting unit 12 supplies the converted voltage to the driver 11 as a monitor voltage $V_{pd}$. The driver 11 performs automatic power control (APC) to cause the laser beam light source 14 to output the laser beam 30 of the stable light quantity on the basis of information indicating a target light quantity in the APC supplied from the light source controller 10 and this monitor voltage $V_{pd}$.

Figure 3:
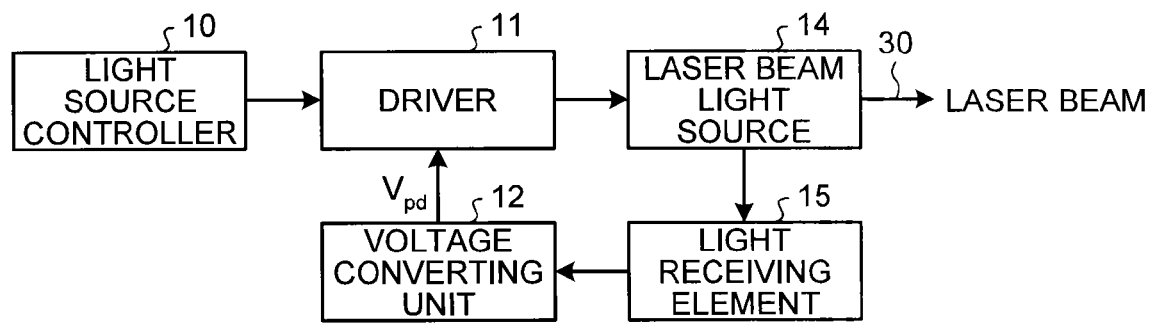
FIG. 3 is an exemplary functional block diagram for explaining the function of an APC system that performs APC on a laser beam light source.

FIG. 3 is an exemplary functional block diagram for explaining the function of an APC system that performs the above-described APC on the laser beam light source 14. In FIG. 3, components in common with FIG. 2 are denoted by the same reference numerals, and detailed description of those components is omitted. As the APC, line APC for performing correction of the light quantity of the laser beam 30 at the timing of every scanning with the laser beam 30 in the main scanning direction can be applied.

The light source controller 10 supplies a drive control signal including a target light quantity of the laser beam 30 in the APC (hereinafter, referred to as an "APC target light quantity $P_{apc}$") to the driver 11 in accordance with an instruction from, for example, a main CPU (not shown). The driver 11 determines a reference voltage value $V_{REF}$ corresponding to the APC target light quantity $P_{apc}$ included in the received drive control signal.

The driver 11 controls a value of drive current to be supplied to the laser beam light source 14 so that the monitor voltage $V_{pd}$, which output of the light receiving element 15 when received the laser beam 30 is converted into a voltage value by the voltage converting unit 12, is equal to this reference voltage value $V_{REF}$. As a result, the laser beam light source 14 stably outputs the laser beam 30 of roughly the APC target light quantity $P_{apc}$.

When image data is supplied to the light source controller 10 from an image processing unit (not shown), the light source controller 10 generates an image-data lighting signal, which is a drive signal for driving the laser beam light source 14 in accordance with the image data, on the basis of the image data and a control signal received from the main CPU (not shown). Furthermore, in accordance with an instruction from the main CPU, the light source controller 10 generates a BD lighting signal for performing BD lighting that causes the laser beam 30 to be emitted at the timing to scan the position of the synchronization detecting unit 23 with the laser beam 30.

Figure 4:
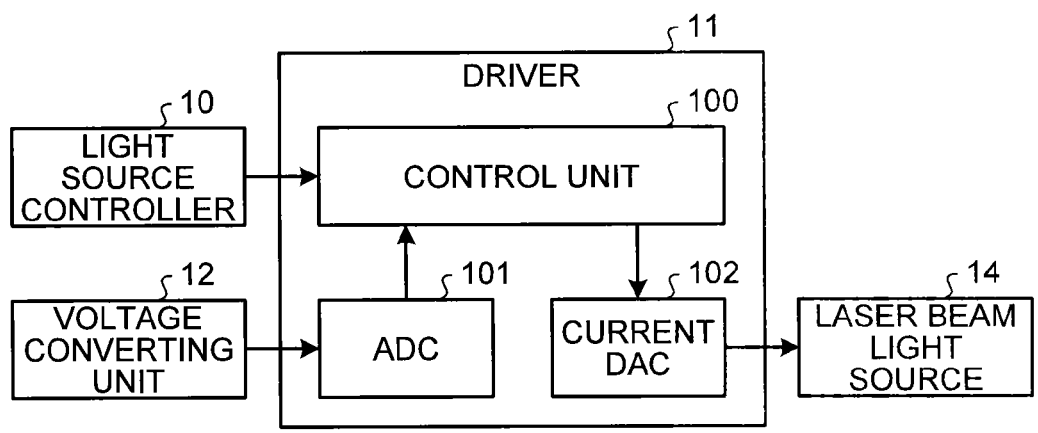
FIG. 4 is a block diagram showing a configuration example of a driver in more detail.

FIG. 4 shows a configuration example of the driver 11 in more detail. In FIG. 4, components in common with FIG. 2 are denoted by the same reference numerals, and detailed description of those components is omitted. As illustrated in FIG. 4, the driver 11 includes a control unit 100, an A/D converter (ADC) 101, and a current D/A converter (DAC) 102.

The control unit 100 receives an APC target light quantity $P_{apc}$, an automatic current control (ACC) target light quantity $P_{acc}$, an APC/ACC switching signal, an image-data lighting signal, an APC lighting signal, and a BD lighting signal which are included in a drive control signal transmitted from the light source controller 10 in accordance with an instruction from the main CPU (not shown). As will be described in detail later, ACC is control to cause the laser beam light source 14 to output the laser beam 30 with a fixed current, and is used in detection of a residual potential of the photosensitive drum 22.

Furthermore, at the time of lighting the laser beam light source 14, the control unit 100 sets a value of drive current to be supplied to the laser beam light source 14 in the current DAC 102. The current DAC 102 outputs a current of the value set as a digital value by the control unit 100 to drive the laser beam light source 14 to light up. The ADC 101 converts the monitor voltage $V_{pd}$ supplied from the voltage converting unit 12 into a digital value within a predetermined range, and supplies the converted digital value to the control unit 100.

The control unit 100 performs the APC when the APC/ACC switching signal included in the drive control signal supplied from the light source controller 10 indicates APC. Specifically, the control unit 100 determines a current value $I_{dac\_apc}$ of drive current for driving the laser beam light source 14 on the basis of the converted digital value of the monitor voltage Vpd supplied from the ADC 101 and a monitor reference value $V_{REF}$ determined according to the APC target light quantity $P_{apc}$ included in the drive control signal, and sets this current value $I_{dac\_apc}$ in the current DAC 102.

On the other hand, when the APC/ACC switching signal indicates ACC, the control unit 100 performs the ACC. Specifically, the control unit 100 calculates a current value $I_{dac\_acc}$ in the ACC on the basis of the present APC target light quantity $P_{apc}$, the present set value set in the current DAC 102, and the next ACC target value $P_{acc}$ as will be described later, and sets the calculated current value $I_{dac\_acc}$ in the current DAC 102.

Figure 5:
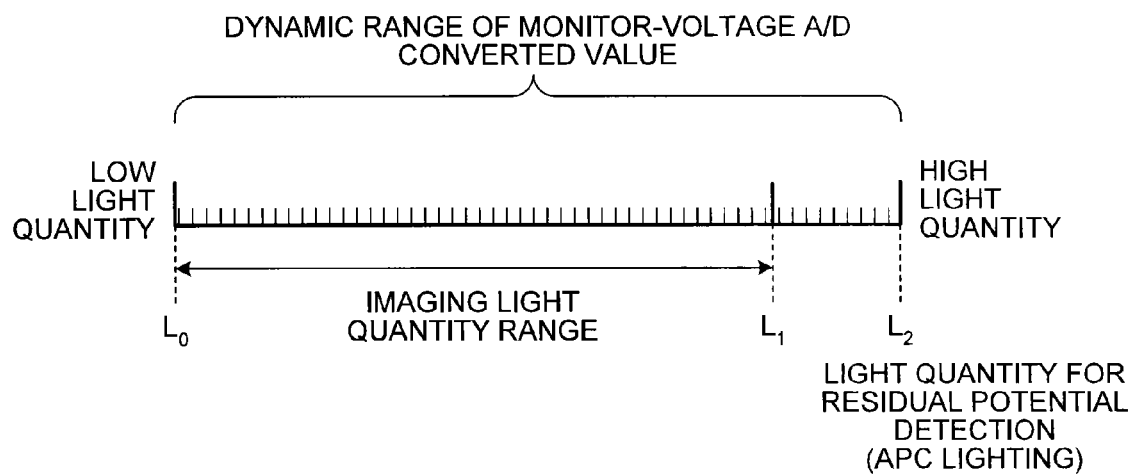
FIG. 5 is a schematic diagram for explaining a method for control of the laser beam light source according to a conventional technology.
Figure 6:
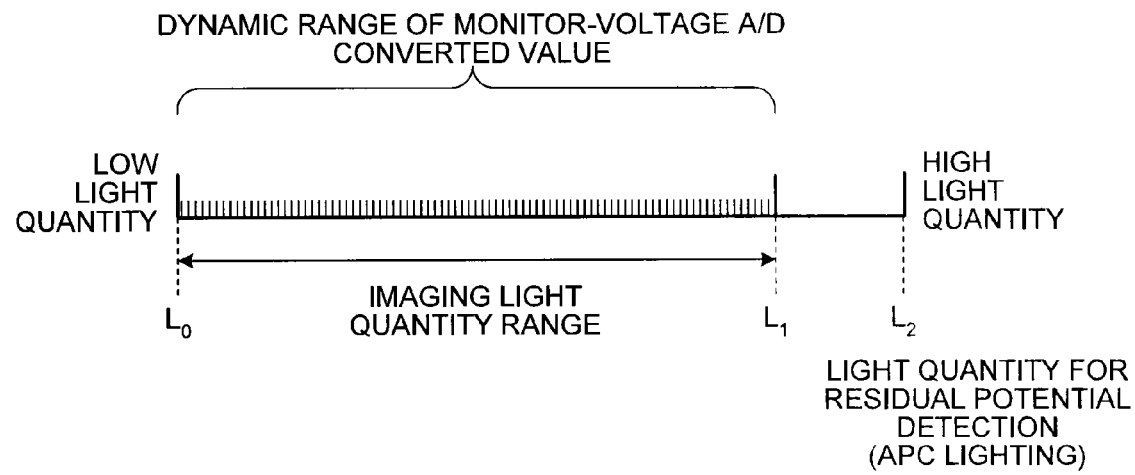
FIG. 6 is a schematic diagram for explaining a method for control of the laser beam light source according to the embodiment of the present invention.

Subsequently, a method for control of the laser beam light source 14 according to the embodiment of the present invention is explained in more detail. FIGS. 5 and 6 show examples of the control method according to a conventional technology and the embodiment of the present invention, respectively.

In FIGS. 5 and 6, the horizontal axis indicates a monitor-voltage A/D converted value that a monitor voltage $V_{pd}$, which output of the light receiving element 15 when received the laser beam 30 output from the laser beam light source 14 is converted into a voltage value, is converted into a digital value by the ADC 101. Hereinafter, scanning the photosensitive drum 22 with the laser beam 30 to form an image according to image data is referred to as "imaging", and a light quantity of the laser beam 30 in imaging is referred to as an "imaging light quantity". In the APC, this imaging light quantity is controlled to be kept within a predetermined range of the APC target light quantity $P_{apc}$.

In FIGS. 5 and 6, monitor-voltage A/D converted values $L_0$ and $L_1$ correspond to lower and upper limits of a range of the imaging light quantity, respectively. Furthermore, a monitor-voltage A/D converted value $L_2$ corresponds to a light quantity of the laser beam 30 for detection of a residual potential of the photosensitive drum 22. As shown in FIGS. 5 and 6, to detect the residual potential of the photosensitive drum 22, the light quantity of the laser beam 30 needs to be set to the light quantity $L_2$ higher than the light quantity $L_1$, the upper limit of the imaging light quantity range.

In the conventional technology, as illustrated in FIG. 5, a whole range $L_0L_2$ of the monitor-voltage A/D converted values $L_0$ to $L_2$ is subject to the APC. In other words, the APC is performed on the light quantity of the laser beam 30 in the range including not only the imaging light quantity range but also a range from the upper limit of the imaging light quantity range to the light quantity for detection of the residual potential. In this case, a dynamic range of the monitor-voltage A/D converted value is the range of the monitor-voltage A/D converted values $L_0$ to $L_2$.

On the other hand, in the present embodiment, as illustrated in FIG. 6, only the imaging light quantity range, i.e., a range $L_0L_1$ of the monitor-voltage A/D converted values $L_0$ to $L_1$ is subject to the APC. As for the light quantity for detection of the residual potential, the light quantity of the laser beam 30 is controlled to a fixed value by the ACC. In this case, a dynamic range of the monitor-voltage A/D converted value is the range $L_0L_1$ of the monitor-voltage A/D converted values $L_0$ to $L_1$, and this is narrower than that is in the example of FIG. 5.

Here, the control unit 100 causes the ADC 101 to convert the monitor voltage $V_{pd}$ supplied from the voltage converting unit 12 from analog to digital, and processes the monitor voltage $V_{pd}$ as a digital value. If a quantization bit rate in the A/D conversion performed by the ADC 101 is the same, higher resolution of the monitor voltage $V_{pd}$ can be obtained by assigning the full scale of the quantization bit rate to a narrower range of the monitor voltage $V_{pd}$.

As an example, when the ADC 101 performs the A/D conversion with a quantization bit rate of 8 bits, the full scale has 256 levels of values of 0 to 255. In the conventional method shown in FIG. 5, the full scale is assigned to the range $L_0L_2$ of the monitor-voltage A/D converted values $L_0$ to $L_2$, and the light quantity is detected in units of a value obtained by dividing the range $L_0L_2$ into 255, and the APC in imaging is performed. On the other hand, in the method according to the present embodiment shown in FIG. 6, the full scale is assigned to the range $L_0L_1$ of the monitor-voltage A/D converted values $L_0$ to $L_1$, and the light quantity is detected in units of a value obtained by dividing the range $L_0L_1$ into 255, and the APC in imaging is performed.

As described above, the light quantity for detection of the residual potential of the photosensitive drum 22 is higher than the upper limit light quantity in the imaging light quantity range, so the range $L_0L_1$ is narrower than the range $L_0L_2$. Therefore, in imaging, by the method according to the present embodiment, the light quantity of the laser beam 30 can be detected at higher resolution and the APC can be performed with a higher degree of accuracy in comparison with the conventional method.

Subsequently, a method to calculate a drive current for driving the laser beam light source 14 to output the laser beam 30 of the light quantity for detection of the residual potential of the photosensitive drum 22 in the ACC is explained.

Figure 7:
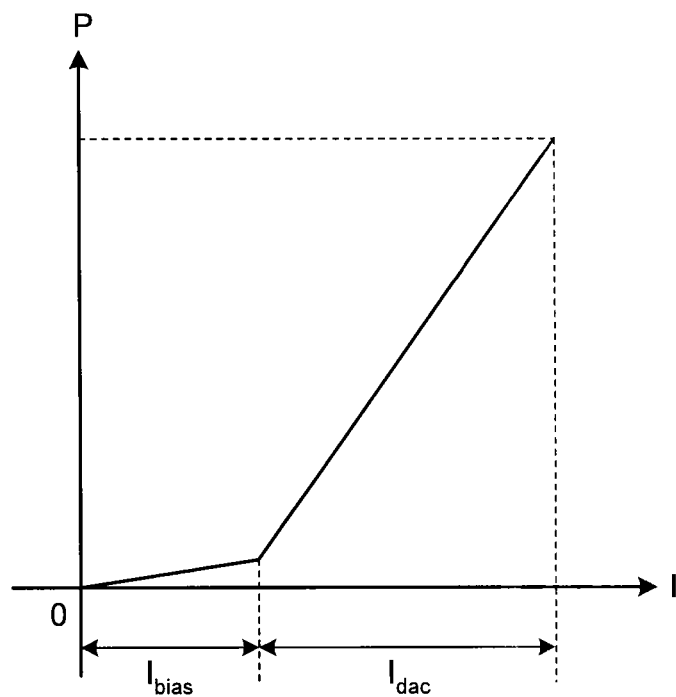
FIG. 7 is a schematic diagram showing an example of a relationship between drive current value L and emitted light quantity P of the laser beam light source.

FIG. 7 shows an example of a relationship between drive current value I and emitted light quantity P of the laser beam light source 14. As shown in FIG. 7, when a drive current value I exceeds a current value Bias, a rate of increase in emitted light quantity P with respect to drive current value I shows a sharp increase, and emitted light quantity P increases roughly in proportion to drive current value I. A region of drive current value I from 0 to the current value Bias is referred to as a "light emitting diode (LED) emission region", and a region of drive current value I from the current value $I_{bias}$ onward is referred to as an "LD emission region".

The current DAC 102 controls the current value Bias, the border between the LED emission region and the LD emission region, and a current $I_{dac}$ in the LD emission region, i.e., a drive current value I exceeding the current value $I_{bias}$. A current value $I_{dac\_acc}$ which is set in the current DAC 102 in the ACC, is calculated by the following Equation (1) using a value of current $I_{dac}$ in the LD emission region.

$$I_{dac\_acc} = (P_{acc}/P_{apc}) \times I_{dac\_apc} \quad (1)$$

Subsequently, the timing to switch to APC or ACC is explained with reference to timing charts shown in FIGS. 8 and 9. The driver 11 switches to either APC or ACC according to a state of an APC/ACC switching signal included in a drive control signal supplied from the light source controller 10.

Figure 8:
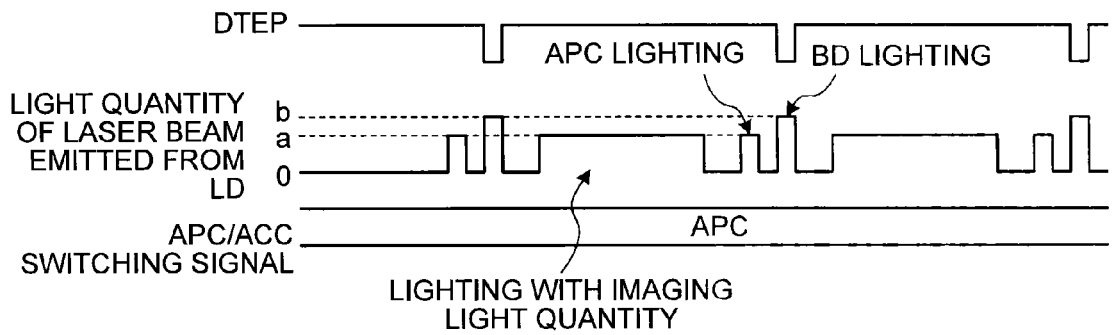
FIG. 8 is a timing chart showing an example of timing when normal APC is performed.

FIG. 8 shows an example where the APC/ACC switching signal indicates APC and normal APC is performed. The driver 11 causes the laser beam light source 14 to emit a laser beam of a light quantity b for BD lighting according to a BD lighting signal supplied from the light source controller 10 at the timing to scan the position of the synchronization detecting unit 23 with the laser beam 30. When the synchronization detecting unit 23 has detected the laser beam 30 (the scanning beam 31) emitted in the BD lighting, the synchronization detecting unit 23 outputs a synchronization signal DTEP. The synchronization signal DTEP is supplied to, for example, the main CPU (not shown).

The main CPU gives the light source controller 10 an instruction for the lighting timing for imaging or the lighting timing for APC on the basis of the synchronization signal DTEP. The light source controller 10 generates a timing signal in accordance with the instruction, and supplies the generated timing signal to the driver 11. In accordance with the supplied timing signal, the driver 11 causes the laser beam light source 14 to emit a laser beam of a light quantity a, which is the imaging light quantity, in a period in which an imaging area of the photosensitive drum 22 is scanned with the laser beam 30, and after that, the driver 11 causes the laser beam light source 14 to emit a laser beam of the light quantity a for APC to an area other than the imaging area. The light quantity a is an APC target light quantity $P_{apc}$.

The light quantity b for BD lighting is set to be equal to or slightly higher than the light quantity a. The BD lighting with the light quantity b of the laser beam can be performed in the ACC or the APC. When the BD lighting is performed in the APC, a target light quantity can be set to a value different from the APC target light quantity $P_{apc}$.

Figure 9:
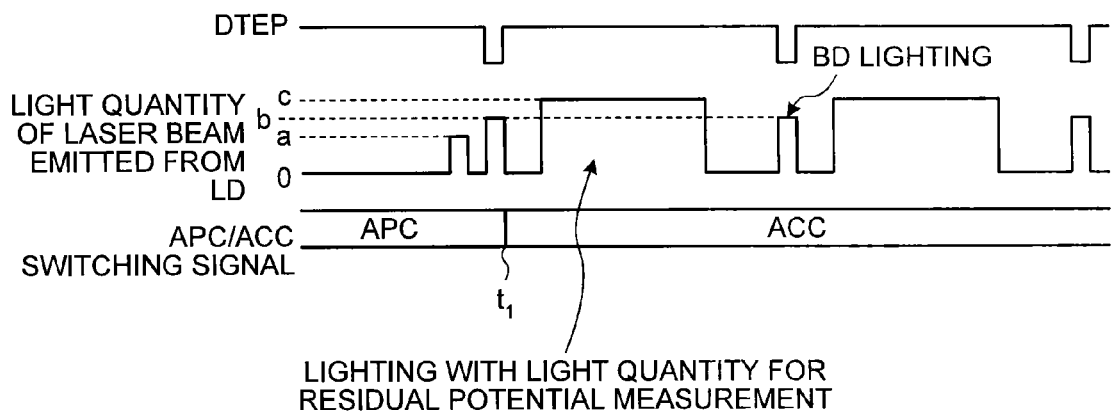
FIG. 9 is a timing chart showing an example of timing when ACC is performed.
Figure 10:
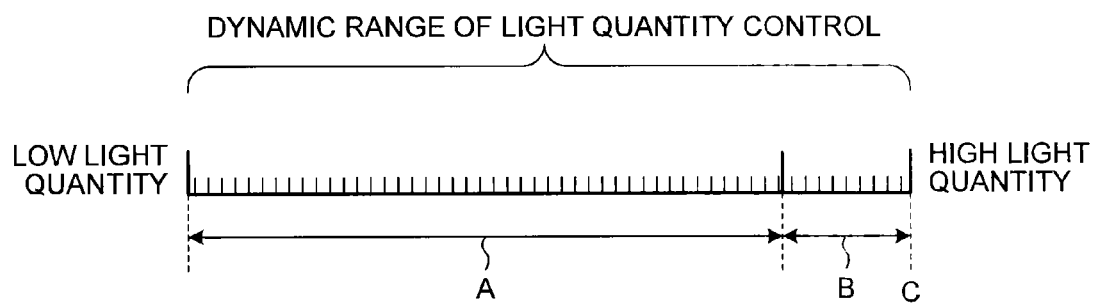
FIG. 10 is a schematic diagram for explaining the light quantity control according to a conventional technology.

FIG. 9 shows an example where the state of the APC/ACC switching signal is switched from APC to ACC and ACC is performed. In this case, the state of the APC/ACC switching signal is switched, for example, by control of the main CPU (not shown). When the state of the APC/ACC switching signal is switched to ACC at a time $t_1$, the control unit 100 of the driver 11 calculates a current value $I_{dac\_acc}$ in accordance with Equation (1), and sets the calculated current value $I_{dac\_acc}$ in the current DAC 102. The time $t_1$ at which the state of the APC/ACC switching signal is switched to ACC can be any time between a time when the BD lighting is ended and immediately before the predetermined timing to emit a laser beam of the light quantity for residual potential measurement.

The light source controller 10 generates a timing signal for performing the APC in accordance with an instruction from the main CPU, and supplies the generated timing signal to the driver 11. In accordance with the supplied timing signal, the driver 11 drives the laser beam light source 14 with a drive current of the current value $I_{dac\_acc}$ in the period in which the imaging area of the photosensitive drum 22 is scanned with the laser beam 30, and causes the laser beam light source 14 to emit a laser beam of a light quantity c, which is the light quantity for residual potential. The light quantity c is a light quantity higher than the light quantity a for APC lighting and the light quantity b for BD lighting. Furthermore, in the state where the APC/ACC switching signal indicates ACC, it is not necessary to perform APC on the imaging light quantity, so the APC lighting is not performed. The BD lighting is performed at predetermined timing in the same manner as in the APC shown in FIG. 8.

In this manner, according to the present embodiment, when the residual potential is detected with a laser beam of a light quantity higher than the imaging light quantity, the APC is targeted at a light quantity within the imaging light quantity range only, and a dynamic range of the monitor-voltage A/D converted value is narrowed down as compared with the case where the APC target is extended to the light quantity for residual potential detection. Therefore, the resolution in monitoring of the light quantity can be increased, and the APC can be performed with a higher degree of accuracy.

Modification of Embodiment

In the above embodiment, it is explained that a current value $I_{dac\_acc}$ to be set in the current DAC 102 in the ACC is calculated using an APC target light quantity $P_{apc}$ corresponding to the imaging light quantity in the currently-performed imaging and a current value $I_{dac\_acc}$. On the other hand, in a modification of the present embodiment, when APC on the light quantity for BD lighting is performed, a current value $I_{dac\_acc}$ to be set in the current DAC 102 in the ACC is calculated by the following Equation (2) using a current value $I_{dac\_apc\_bd}$ and APC target light quantity $P_{apc\_bd}$ for performing the APC for BD lighting, and an ACC target light quantity $P_{acc}$ in the ACC.

$$I_{dac\_acc} = (P_{acc}/P_{apc\_db}) \times I_{dac\_apc\_bd} \quad (2)$$

In FIG. 7, it is indicated that drive current value I and emitted light quantity P are in a direct proportional relationship in the LD emission region exceeding the current value $I_{bias}$; however, actually, the relationship between drive current value I and emitted light quantity P is a slightly-distorted direct proportional relationship. Therefore, if the APC target light quantity $P_{apc}$ for imaging lighting varies at the time of calculation of a current value $I_{dac\_acc}$ to be set in the current DAC 102 in the ACC, the current value $I_{dac\_acc}$ in the ACC also varies, and as a result, the light quantity for ACC lighting is likely to vary.

Therefore, as in the modification of the present embodiment, the current value $I_{dac\_acc}$ in the ACC is calculated using the APC target light quantity $P_{apc\_bd}$ and current value $I_{dac\_apc\_bd}$ for BD lighting in addition to the imaging light quantity. The light quantity for BD lighting is preferably set to a constant value in order to stabilize a synchronization signal DTEP, which is an output signal of the synchronization detecting unit 23. This stabilizes the current value $I_{dac\_acc}$ to be set in the current DAC 102 in the ACC, and can suppress the variation in the light quantity $P_{acc}$ in the ACC lighting.

As for the APC lighting in the APC on the light quantity for BD lighting, the BD lighting shown in FIG. 8 can be used as the APC lighting, or the lighting timing for the APC lighting can be newly set in between a lighting period in which the imaging light quantity of a laser beam is emitted and the BD lighting timing.

According to the embodiments, it is possible to improve the accuracy of the imaging light quantity control in a configuration to detect a residual potential of a photosensitive element.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical device comprising:
a drive unit configured to drive a light source that outputs a laser beam;
a detecting unit configured to detect the laser beam output from the light source;
a converting unit configured to convert an output of the detecting unit into a value within a predetermined range; and
a control unit configured to control the drive unit to switch a light quantity of the laser beam output from the light source from a first light quantity within an imaging light quantity range for forming an image to a second light quantity outside the imaging light quantity range, or vice versa, wherein
when the control unit has switched the light quantity of the laser beam to the first light quantity, the converting unit converts an upper limit light quantity in the imaging light quantity range which is an output of the detecting unit into a maximum value in the predetermined range, and converts a lower limit light quantity in the imaging light quantity range which is an output of the detecting unit into a minimum value in the predetermined range.

2. The optical device according to claim 1, wherein
when controlling the light quantity of the laser beam to the first light quantity, the control unit calculates a value of drive current for causing the drive unit to drive the light source to output the second light quantity of the laser beam on the basis of a value of drive current with which the light source is driven, a target value of the first light quantity, and a target value of the second light quantity.

3. The optical device according to claim 1, wherein
when controlling the light quantity of the laser beam to a third light quantity of the laser beam which enters a synchronization detecting unit for detecting synchronous timing of the laser beam, the control unit calculates a value of drive current for causing the drive unit to drive the light source to output the second light quantity of the laser beam on the basis of a value of drive current with which the light source is driven, a target value of the second light quantity, and a target value of the third light quantity.

4. The optical device according to claim 1, wherein
the second light quantity is a light quantity for detecting a residual potential of a photosensitive element to be scanned with the laser beam.

5. An image forming apparatus comprising:
the optical device according to claim 1; and
an image forming unit configured to perform image formation by scanning a photosensitive element with the laser beam.

6. A method for controlling an optical device, the method comprising:
driving a light source that outputs a laser beam by a drive unit;
detecting the laser beam output from the light source by a detecting unit;
converting output at the detecting into a value within a predetermined range by a converting unit; and
controlling the drive unit to switch a light quantity of the laser beam output from the light source from a first light quantity within an imaging light quantity range for forming an image to a second light quantity outside the imaging light quantity range, or vice versa, wherein
the converting includes converting an upper limit light quantity in the imaging light quantity range which is an output of the detecting unit into a maximum value in the predetermined range and converting a lower limit light quantity in the imaging light quantity range which is an output of the detecting unit into a minimum value in the predetermined range when the light quantity of the laser beam has been switched to the first light quantity at the controlling.

* * * * *